(12) United States Patent
Pai et al.

(10) Patent No.: US 8,481,862 B2
(45) Date of Patent: Jul. 9, 2013

(54) LOW PROFILE COMPLIANT LEADS

(75) Inventors: Deepak K. Pai, Burnsville, MN (US); Melvin Eric Graf, Bloomington, MN (US)

(73) Assignee: General Dynamics Advanced Information Systems, Inc., Fairfax, VA (US)

( * ) Notice: Subject to any disclaimer, the term of this patent is extended or adjusted under 35 U.S.C. 154(b) by 1584 days.

(21) Appl. No.: 11/350,276

(22) Filed: Feb. 9, 2006

(65) Prior Publication Data

US 2007/0190822 A1    Aug. 16, 2007

(51) Int. Cl.
*H05K 1/16* (2006.01)

(52) U.S. Cl.
USPC .......................... 174/260; 174/254

(58) Field of Classification Search
USPC .................... 174/260, 261; 439/66
See application file for complete search history.

(56) References Cited

U.S. PATENT DOCUMENTS

| | | | |
|---|---|---|---|
| 4,677,458 A * | 6/1987 | Morris | 257/696 |
| 4,736,520 A | 4/1988 | Morris | |
| 4,751,199 A * | 6/1988 | Phy | 29/827 |
| 5,171,417 A | 12/1992 | DiFranco et al. | |
| 5,177,326 A | 1/1993 | Goldhammer | |
| 5,215,645 A | 6/1993 | DiFranco et al. | |
| 5,343,073 A | 8/1994 | Parthasarathi et al. | |
| 5,440,452 A | 8/1995 | Kitahara | |
| 5,541,367 A | 7/1996 | Swamy | |
| 5,568,363 A | 10/1996 | Kitahara | |
| 5,729,440 A * | 3/1998 | Jimarez et al. | 361/779 |
| 5,731,631 A | 3/1998 | Yama et al. | |
| 5,807,767 A | 9/1998 | Stroupe | |
| 5,839,190 A | 11/1998 | Sullivan | |
| 5,945,729 A | 8/1999 | Stroupe | |
| 5,966,592 A | 10/1999 | Beroz et al. | |
| 5,974,662 A | 11/1999 | Eldridge et al. | |
| 6,069,028 A | 5/2000 | Stroupe | |
| 6,224,396 B1 * | 5/2001 | Chan et al. | 439/71 |
| 6,307,254 B1 | 10/2001 | Stroupe | |
| 6,309,913 B1 | 10/2001 | Stroupe | |
| 6,465,744 B2 | 10/2002 | Baker et al. | |
| 6,472,725 B1 | 10/2002 | Stroupe | |
| 6,545,226 B2 * | 4/2003 | Brodsky et al. | 174/260 |
| 6,555,897 B2 | 4/2003 | Stroupe | |
| 6,573,459 B2 | 6/2003 | Baker et al. | |
| 6,784,378 B2 * | 8/2004 | Zhu et al. | 174/267 |
| 6,867,984 B2 * | 3/2005 | Chen | 361/804 |
| 2002/0047117 A1 | 4/2002 | Stroupe | |
| 2003/0034490 A1 | 2/2003 | Stroupe | |

* cited by examiner

*Primary Examiner* — Ishwarbhai Patel
(74) *Attorney, Agent, or Firm* — Ingrassia Fisher & Lorenz, P.C.

(57) ABSTRACT

The present invention relates to a connector system for resiliently attaching and electrically connecting an integrated circuit chip to a circuit board using a plurality of leads. Each of the plurality of leads are sized and arranged to form a curved body having a first leg and a second leg with a curved portion between the first leg and the second leg. The curved body of the leads may be C-shaped in accordance with the present invention. The plurality of leads may be formed from strips of copper foil or copper mesh folded to form the curved body. The plurality of leads may also be sized and arranged to support the integrated circuit chip in a generally flat arrangement relative to the circuit board with a maximum separation of about 0.016 inches or less between the integrated circuit chip and the circuit board.

12 Claims, 4 Drawing Sheets

LOW PROFILE COMPLIANT LEADS

FIELD OF THE INVENTION

The present invention is related to electromechanical leads connecting integrated circuit packages to printed wire boards (PWB), and more particularly to leads having a low profile.

BACKGROUND OF THE INVENTION

The present invention relates to connectors for mounting integrated circuit packages to circuit boards. More particularly, the present invention relates to a resilient connection for supporting an integrated circuit chip or multiple-chip module (MCM) on a circuit board, and for providing a low profile or reduced total height off the circuit board.

In the past, leadless ceramic chip carriers (LCCCs), which typically have a different thermal coefficient of expansion (TCE) than circuit boards, exhibited problems when exposed to harsh thermally cyclic environments and vibration. The solder joints, which connect the LCCC to a circuit board, often degraded and cracked over time as a result of stresses and strains induced at the solder joint by temperature cycling. Ultimately, thermal expansion and contraction in the solder joints caused both mechanical and electrical failure, resulting in failures in the electronic system.

One solution has been to provide a compliant electrical interface between the leadless chip carrier and the circuit board. Such an interface is described in detail in the U.S. Pat. No. 4,827,611 issued to Pai et al. and in the U.S. Pat. No. 5,294,039 issued to Pai et al., which are hereby fully incorporated by reference. The curved leads described in the Pai et al. patents serve as an electrically conductive path between the LCCC and the circuit board. The curved leads also form a mechanically compliant interface that withstands the damaging thermal stresses and other mechanical vibrations that degrade and destroy solder joints in previous interfaces.

Although compliant interfaces, such as the ones described in the Pai et al patents, provide an effective interface between the LCCC and the circuit board, they are subject to certain problems. The curved leads, which often come in both "S" and "C" shapes, include minimum dimensions, such as a minimum radius of curvature in the curved leads. As a result, the total height of an integrated circuit off the printed wiring board faces certain limitations when attempting to reduce the overall height of the electronics board. For example, the 0.005 inch thick copper alloy, typically used for its electrical conductivity, exhibits a minimum height when formed into leads due to the stress and fracturing of the material when bent too sharply. As such, typical "S" type leads include a minimum height profile of about 0.068 inches and typical "C" type leads include a minimum height profile of about 0.040 inches.

Likewise, other complaint leads, such as those described in the U.S. Pat. No. 6,000,126 issued to Pai et al. and the U.S. Pat. No. 6,493,238 issued to Pai et al. which are hereby fully incorporated by reference, also include certain limitations to the reduction of overall height. The U.S. Pat. No. 6,000,126 typically includes a minimum height profile of about 0.080 inches due to the handling of the pins in mass production and the need to provide sufficient compliancy for the solder joints. Further, the U.S. Pat. No. 6,493,238 typically includes a minimum height profile of about 0.030 due to the difficulties of forming copper disks from a 0.005 inch thick material, which is needed for electrical conductivity.

Unfortunately, many current electronic applications require increase packaging ability, forcing electronic designers to package more electronics into smaller volumes without sacrificing reliability and resistance to thermal cycling. For example, VersaModule Eurocard ("VME") module applications, such as industrial, commercial and military applications, often require reduced height electronic boards. The VME specification or form factor, which has been developed by Motorola, Signetics, Mostek and Thompson CSF, includes a standard for the length, height and width of the modules to be inserted in a standard backplane. The width of the module (which can include components on both sides, board, a stiffener frame, and a heat sink) cannot exceed the envelope provided. This is also true with modem high-density, high-performance electronic modules with other form factors. As such, several LCCC components used on VME modules and backplanes require reduced height or low profile compliant leads due to total thickness restrictions.

Therefore, it would be desirable to provide a compliant lead for mounting integrated circuit packages to circuit boards which is resistant to thermal cycling and provides a low profile.

SUMMARY OF THE INVENTION

The present invention is related to electromechanical leads connecting integrated circuit packages to printed wire boards (PWB), and more particularly to leads having a low profile.

One embodiment of the present invention may include a connector system for resiliently attaching and electrically connecting a first set of contacts substantially located on a first surface of a circuit chip to a second set of contacts substantially located on a second surface of a circuit board. The connector system may include a plurality of leads in predetermined spaced relation, each of the plurality of leads being sized and arranged to form a C-shaped body having a first leg and a second leg, the first leg and the second leg being substantially parallel with a curved portion between the first leg and the second leg. Each of the plurality of leads may include a strip of copper foil folded to form the C-shaped body with the first leg having a first surface configured to connect to at least one of the first set of contacts and the second leg having a second surface configured to connect to at least one of the second set of contacts, the plurality of leads being sized and arranged such that the first surface of the circuit chip is substantially parallel to the second surface of a circuit board. Further, the plurality of leads may define a separation of about 0.010 inches or less between the first surface of the circuit chip and the second surface of the circuit board.

Another embodiment of the present invention may include a connector system for resiliently attaching and electrically connecting a first set of contacts substantially located on a first surface of a circuit chip to a second set of contacts substantially located on a second surface of a circuit board. The connector system may include a plurality of leads in predetermined spaced relation, each of the plurality of leads being sized and arranged to form a C-shaped body having a first leg and a second leg, the first leg and the second leg being substantially parallel with a curved portion between the first leg and the second leg. Each of the plurality of leads may include a strip of mesh folded to form the C-shaped body with the first leg configured to connect to at least one of the first set of contacts and the second leg configured to connect to at least one of the second set of contacts, the plurality of leads being sized and arranged such that the first surface of the circuit chip is substantially parallel to the second surface of a circuit board. Further, the plurality of leads may define a separation of about 0.016 inches or less between the first surface of the circuit chip and second surface of the circuit board.

Yet another embodiment of the present invention may include a method of electrically and mechanically connecting a circuit chip to a circuit board, the circuit chip having a plurality of first contacts and the circuit board having a plurality of second contacts. The method may include the steps of applying a first strip and second strip of liquid solder mask to a copper foil and plating exposed surfaces of the copper foil with at least one of an immersion silver and an immersion tin. The method may also include the steps of trimming the copper foil into leads, each lead having a first end and a second end, the first end of each lead including a portion of the first strip of liquid solder mask and the second end of the lead including a portion of the second strip of liquid solder mask and attaching the first end of each lead to at least one first contact. Further, the method may include the steps of folding the leads into a C-shape having a first leg and a second leg, the first leg and the second leg being substantially parallel with a curved portion between the first leg and the second leg, the first leg including the first end of the lead and the second leg including the second end of the lead and attaching the second end of each lead to at least one second contact.

Yet another embodiment of the present invention may include a method of electrically and mechanically connecting an circuit chip to a circuit board, the circuit chip having a plurality of first contacts and the circuit board having a plurality of second contacts, the method including the steps of plating exposed surfaces of a mesh with at least one of an immersion silver and an immersion tin and trimming the mesh into leads, each lead having a first end and a second end. The method may also include the steps of attaching the first end of each lead to at least one first contact, folding each of the leads into a C-shape having a first leg and a second leg, the first leg and the second leg being substantially parallel with a curved portion between the first leg and the second leg, the first leg including the first end of the lead and the second leg including the second end of the lead and attaching the second end of each lead to at least one second contact.

These and other objects and advantages of the invention will be apparent from the following description, the accompanying drawings and the appended claims.

BRIEF DESCRIPTION OF THE DRAWINGS

While the specification concludes with claims particularly pointing out and distinctly claiming the present invention, it is believed the same will be better understood from the following description taken in conjunction with the accompanying drawings, which illustrate, in a non-limiting fashion, the best mode presently contemplated for carrying out the present invention, and in which like reference numerals designate like parts throughout the Figures, wherein:

DETAILED DESCRIPTION OF THE INVENTION

The present disclosure will now be described more fully with reference to the Figures in which various embodiments of the present invention are shown. The subject matter of this disclosure may, however, be embodied in many different forms and should not be construed as being limited to the embodiments set forth herein.

The present invention relates to cost effective compliant leads and a method of producing the compliant leads. In accordance with the present invention, the compliant leads may be configured to minimize the effects of TCE mismatch between leadless ceramic chip carriers (LCCC) packages and printed wiring boards while providing a low profile connector for minimizing the overall height of a completed circuit board. The compliant characteristics of the leads may serve to enhance interconnect reliability and robustness of the circuit board during thermal cycling and under mechanical vibration.

In accordance with at least one embodiment of the present invention, compliant leads may be used to mount LCCC components circuit boards with the compliant leads having a reduced height or profile of approximately 0.010 inches or less. As discussed above, such low profile connection may be desired on some VME modules and backplanes which require reduced thickness due to total thickness restrictions. In one embodiment of the present invention, rolled annealed 2 oz (0.0028 inches thick) copper foil with solder mask may be used to connect the LCCC to a printed wiring board (PWB). The rolled copper foil may be formed from a thick copper sheet rolled into a thinner sheet as known to those of skill in the art. As would be apparent to those of skill in the art, the foil may be fabricated from other common materials having sufficient electrical conductivity known to those in the art such as steel, aluminum, etc. The surface of the copper foil may be finished with an immersion silver of tin before being folded into a "C" shape and attached to the LCCC and the PWB.

Figure 1A:
FIG. 1A shows a top view of a copper foil, copper wire mesh, or stainless steel wire mesh used in making a low profile compliant lead in accordance with one embodiment of the present invention.
Figure 1B:
FIG. 1B shows a side view of the copper foil, copper wire mesh, or stainless steel wire mesh of FIG. 1A in accordance with one embodiment of the present invention.
Figure 1C:
FIG. 1C shows a bottom view of the copper foil, copper wire mesh, or stainless steel wire mesh of FIG. 1A in accordance with one embodiment of the present invention.

FIGS. 1A, 1B, and 1C show a top view, side view, and bottom view respectively of a sheet 10 of conductive material. In accordance with one embodiment of the present invention, the sheet may be formed from 2-oz (0.0028 inch thick) copper foil. As discussed below, the sheet 10 may also be formed from copper or stainless steel wire mesh in alternative embodiments of the present invention.

As shown in FIG. 1A, the sheet 10 of copper foil may be sized according to the number and size of leads to be fabricated. For example, the width of the sheet 10 may correspond to the length of the leads to be formed and the length of the sheet 10 may correspond to the width of the leads multiplied by the number of leads to be formed. In one embodiment, the copper foil may be between approximately 0.002 to 0.005 inches thick and may start as a 12 inch×18 inch panel before being trimmed into smaller sections, which are eventually made into leads. However, as would be apparent to one of ordinary skill in the art, the sheet 10 may be trimmed and configured depending on the size, shape, and number of the completed compliant leads.

Figure 2A:
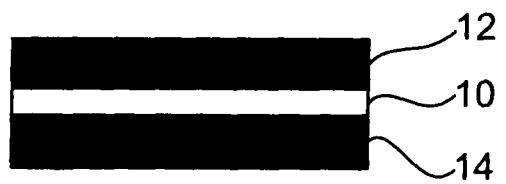
FIG. 2A shows a top view of a copper foil, copper wire mesh, or stainless steel wire mesh used in making a low profile compliant lead in accordance with one embodiment of the present invention.
Figure 2B:
FIG. 2B shows a side view of the copper foil, copper wire mesh, or stainless steel wire mesh of FIG. 2A in accordance with one embodiment of the present invention.
Figure 2C:
FIG. 2C shows a bottom view of the copper foil, copper wire mesh, or stainless steel wire mesh of FIG. 2A in accordance with one embodiment of the present invention.

FIGS. 2A, 2B, and 2C show a top view, side view, and bottom view respectively of the copper foil with strips 12 and 14 of liquid solder mask have been applied. The strips 12 and 14 may be applied precisely and cleaned, in accordance with methods known to those of skill in the art. Further, the copper foil may be cleaned as necessary to protect areas from solder build-up in subsequent operations. It should be understood that the strips 12 and 14 may be formed from a liquid solder mask having a thickness of approximately 0.0007 inch, from a dry film solder mask having a thickness of approximately 0.0025 to 0.005 inch or from other solder masks known to those of skill in the art.

In another embodiment of the present invention, after applying the solder mask, exposed surfaces of the copper foil may be plated with an immersion of silver or tin (white tin) in order to provide a more solderable surface and prevent the copper surfaces from oxidizing and corroding. As would be apparent to those of skill in the art, other immersion materials may be used without deviating from the scope and spirit of the present invention.

Figure 3A:
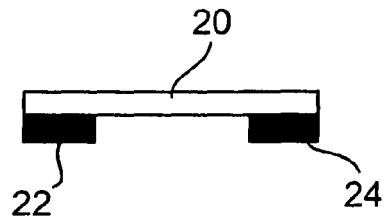
FIG. 3A shows a side view of a single lead trimmed from the foil shown in FIG. 2A in accordance with an embodiment of the present invention.

FIG. 3A shows a single lead 20 trimmed from sheet 10 of copper foil such that sections of the strips 12 and 14 form two portions 22 and 24 of liquid solder mask at either end of the lead 20. The dimensions of the lead 20 may be approximately 0.050 to 0.080 inch long by approximately 0.010 to 0.020 inch wide by approximately 0.0028 inch thick. The sheet 10 may yield approximately 5,000 leads 20 from a single 12 inch×18 inch copper foil. The leads 20 may be trimmed to a width of approximately 0.022 to 0.028 inches when used with 0.050 pitch LCCC pad, which are approximately 0.025 +/−0.003 inch wide and approximately 0.050+/−0.003 inch long. The leads 20 may be trimmed to a width of approximately 0.017 to 0.023 inches when used with a 0.040 pitch LCCC pad, which are approximately 0.020+/−0.003 inch wide and approximately 0.040+/−0.003 inch long. The length of the leads 20 may be twice the length of the LCCC pads plus 0.1000 inches. It should be understood, however, that the dimensions of the leads 20 may be changed or varied depending on the PWB design and the design of the LCCC.

Figure 3B:
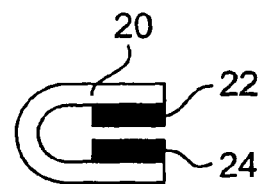
FIG. 3B shows a side view of the single lead of FIG. 3A folded in accordance with an embodiment of the present invention.

FIG. 3B shows one embodiment of the present invention where the lead 20 may be folded into a "C" shape before soldering such that the solder mask portions 22 and 24 are placed on the inside of the "C" shape as shown. As would be apparent to one of skill in the art, the ends of the lead 20 with the solder mask portions 22 and 24 do not join each other, but rather are kept separate by the solder mask portions, which allows the two ends of the lead to move relative to each other after soldering, assuring compliancy. The leads may be folded manually for a small batch production or by using a tool with 0.010 diameter wire for guide in the fold areas in a large production.

Figure 3C:
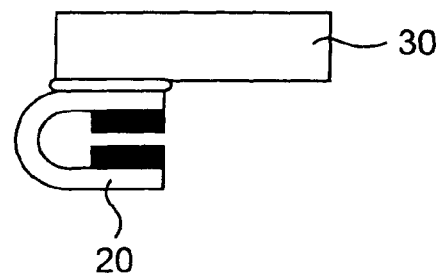
FIG. 3C shows a side view of the single folded lead of FIG. 3B soldered to a circuit chip in accordance with an embodiment of the present invention.

Once folded, the lead 20 may be attached to the LCCC pads 30 as shown in FIG. 3C. Sn96.5:Ag3.5 solder alloy (MP 221° C.) or other suitable solder or material known to those of skill in the art may be used to attach the lead 20 to the LCCC 30. A slotted tool (graphite or aluminum) may be used to locate leads prior to mass soldering. It should be noted that the attachment of the lead 20 may be reversed or otherwise positioned, for example with the opening of the "C" shaped lead may face outward or away from the LCCC as an alternative to the embodiment shown in FIG. 3C.

Figure 3D:
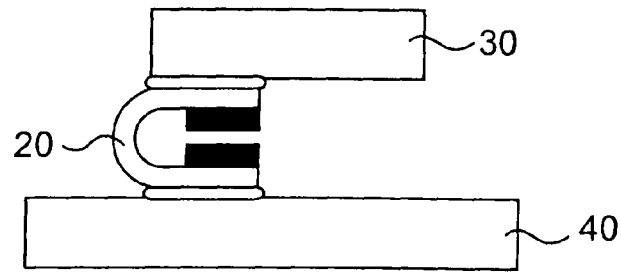
FIG. 3D shows a side view of the single folded lead of FIG. 3B soldered to a circuit chip and to a circuit board in accordance with an embodiment of the present invention.

Finally, the lead 20 may be attached to the PWB 40 per a standard process as shown in FIG. 3D. Standard PWB soldering process includes 1) application of solder paste to the PWB pads; 2) placement of the leaded component on the PWB; and 3) reflow solder paste in convection reflow equipment or vapor phase solder equipment to achieve good solder joints. Soldering the folded lead to the board supports the shape of the lead and provides electrical connection with compliancy in the length of the lead 20 to accommodate thermal expansion mismatch.

Upon attaching the LCCC to the PWB, the total height of the soldered copper foil lead 20 may be approximately 0.010 inch including the solder joints and the folded lead. The copper foil lead 20, in accordance with the present invention, may reduce the total height required to attach the LCCC by approximately 0.030 inch over conventional "C" leads or approximately 0.060 inch over conventional "S" leads known to those of skill in the art.

In accordance with another embodiment of the present invention, copper wire mesh having a grid size of approximately 0.004×0.004 or equivalent may be used to connect a LCCC to a PWB. The copper mesh may include approximately 0.004 inch diameter pure copper wires weaved into a mesh similar to cloth. As an alternative, a fine wire mesh may be used. The fine wire mesh may be formed from approximately 0.001 inch diameter stainless steel wire, plated with 0.001 thick copper. The surface of the copper wire mesh may be finished with an immersion silver of tin before being folded into a "C" shape and attached to the LCCC and the PWB.

As mentioned, the sheet 10 of conductive material, shown in FIGS. 1A, 1B, and 1C, may be formed from a copper wire mesh or stainless steel wire mesh. In one embodiment, the copper wire mesh has a grid size of approximately 0.004× 0.004 inch. The copper mesh typically includes an initial thickness of approximately 0.008 inch. When stainless steel wire mesh is used, the thickness of the stainless steel wire mesh typically includes approximately 0.001 inch diameter stainless steel wire, approximately 0.001 inch thick copper plating, and approximately 0.00005 thick silver or tin surface finishes, resulting in a total thickness of approximately 0.004 inch. As would be apparent to one of ordinary skill in the art, the copper mesh or stainless steel mesh may be shaped and configured depending on the size and shape of the completed compliant lead. Further, the shape of the initial copper mesh or stainless steel mesh may be easily trimmed or sized to meet various shapes and numbers of leads.

As would be apparent to one of ordinary skill in the art, the exposed surfaces of the copper mesh or the stainless steel mesh may be plated with an immersion of silver or tin (white tin) in order to provide a more solderable surface and prevent the copper surfaces from oxidizing and corroding. The typical plating thickness may be approximately 0.000050 inch. Also, other immersion materials may be used without deviating from the scope and spirit of the present invention.

Figure 4A:
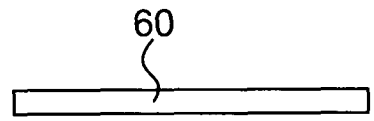
FIG. 4A shows a side view of a single lead trimmed from the copper wire mesh or stainless steel wire mesh shown in FIG. 1A in accordance with an embodiment of the present invention.

FIG. 4A shows a single lead 60 trimmed from the sheet 10 of copper mesh, or alternatively the stainless steel mesh. Typically, the sheet 10 may yield approximately 5,000 usable leads from a 12×18 inch sheet 10. In one embodiment, the leads 60 may be trimmed to a width of approximately 0.022 to 0.028 inches when used with 0.050 pitch LCCC pad, which are approximately 0.025+/−0.003 inch wide and approximately 0.050+/−0.003 inch long. Alternatively, the leads 60 may be trimmed to a width of approximately 0.017 to 0.023 inches when used with a 0.040 pitch LCCC pad, which are approximately 0.020+/−0.003 inch wide and approximately 0.040+/−0.003 inch long. The length of the leads 60 may be twice the length of the LCCC pads plus 0.1000 inches. It should be understood that the dimensions of the leads 60 may be changed or varied depending on the PWB design and the design of the LCCC.

Figure 4B:
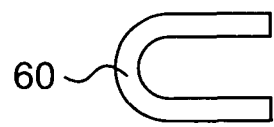
FIG. 4B shows a side view of the single lead of FIG. 4A folded in accordance with an embodiment of the present invention.
Figure 4C:
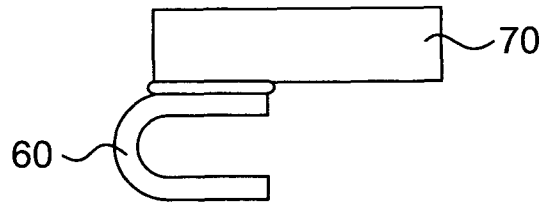
FIG. 4C shows a side view of the single folded lead of FIG. 4B soldered to a circuit chip in accordance with an embodiment of the present invention.

FIG. 4B shows the lead 60 folded into a "C" shape. Once folded, the lead 60 may be attached to the LCCC pads 70 as shown in FIG. 4C. Again, Sn96.5:Ag3.5 solder alloy (MP 221° C.) or other suitable solder or material known to those of skill in the art may be used to attach the lead 60 to the LCCC 70.

It should be noted that the attachment of the lead 60 may be reversed or otherwise positioned, for example with the opening of the "C" shaped lead may face outward or away from the LCCC as an alternative to the embodiment shown in FIG. 4C. Further, a removable polyimide spacer (approximately 0.001 inches thick) or other spacer known to those of skill in the art (not shown in the figures) may be used in order to support and position the lead during soldering. The spacer may be formed of Kapton or an alternate high temperature film. One of ordinary skill in the art will realize that the attachment and placement of the spacer may be accomplished using any method known in the art.

Figure 4D:
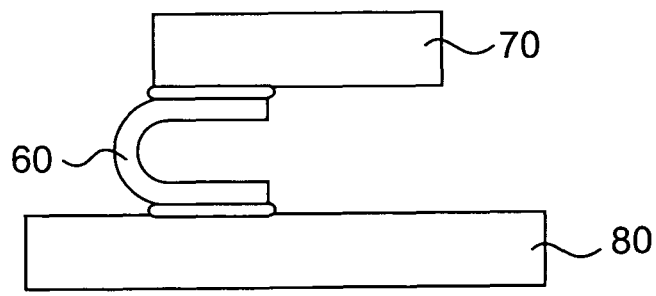
FIG. 4D shows a side view of the single folded lead of FIG. 4B soldered to a circuit chip and to a circuit board in accordance with an embodiment of the present invention.

Finally, the lead 60 may be attached to the PWB 80 per a standard process as shown in FIG. 4D. When using the lead 60, step soldering may be used to connect the lead 60 to the LCCC and the PWB in accordance with methods known to those of skill in the art. Using a step soldering method, solder alloys of two different melting temperatures may be used to solder both joints while keeping the joints separated from each other and provide compliancy. It should be understood that the step soldering method may also be used with the copper foil leads as shown in FIGS. 3A, 3B, 3C, and 3D.

Upon attaching the LCCC to the PWB, the total height of the lead 60 is approximately 0.016 inch including the solder joints and the folded lead when using the copper mesh. As would be apparent to those of skill in the art, the total height of the board and component depends on the type of component used. However, the copper mesh leads in accordance with the present invention reduce the total height by approximately 0.024 inch for a conventional "C" lead and by approximately 0.056 inch for a conventional "S" lead. If stainless steel mesh is used, the height of the lead 60 is approximately 0.005 inch including the solder joints and the folded lead. The stainless steel mesh leads, in accordance with the present invention, reduce the total height by approximately 0.035 inch for a conventional "C" lead and by approximately 0.065 inch for a conventional "S" lead.

Standard surface mount techniques may be used to make the solder connection for the lead 20 to PWB 40 as shown in FIG. 3D and lead 60 and PWB 80 as shown in FIG. 4D. The PWB may include contacts on the circuit board which are configured to match the pattern of leads on the LCCC such that solder joints may be formed between leads and the contacts on circuit board. Mechanical and electrical connections may therefore be formed between the LCCC pads/contacts and the contacts on circuit board. If one was used, the polyimide spacer may be removed after soldering.

Figure 5:
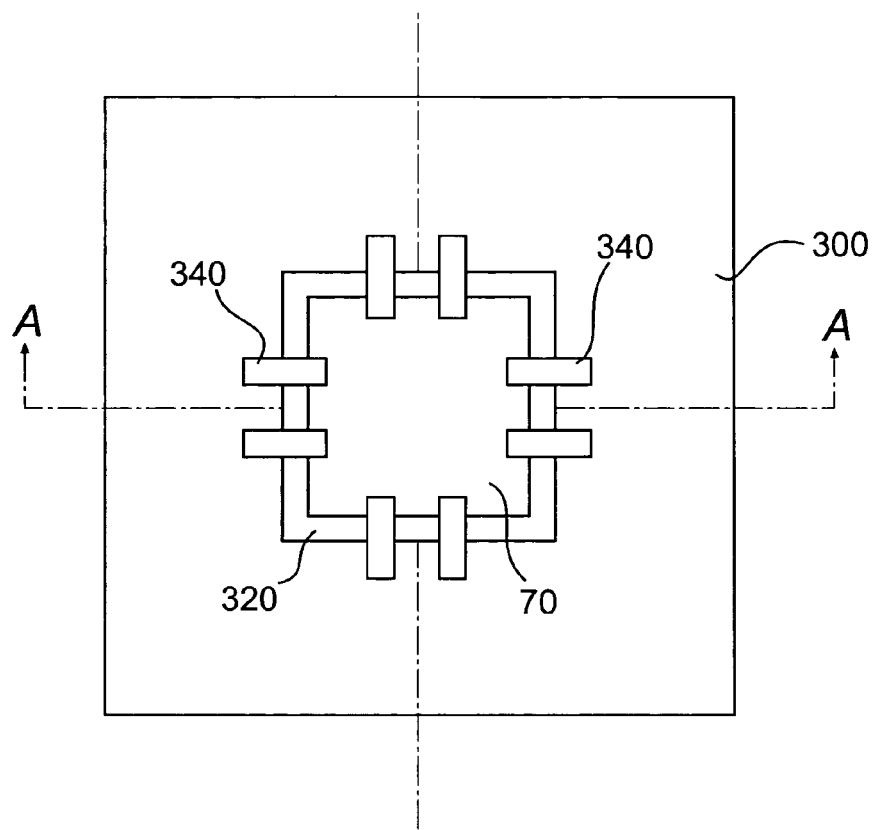
FIG. 5 shows a top view of a slotted tool holding a component and leads prior to soldering in accordance with one embodiment of the present invention.
Figure 6:
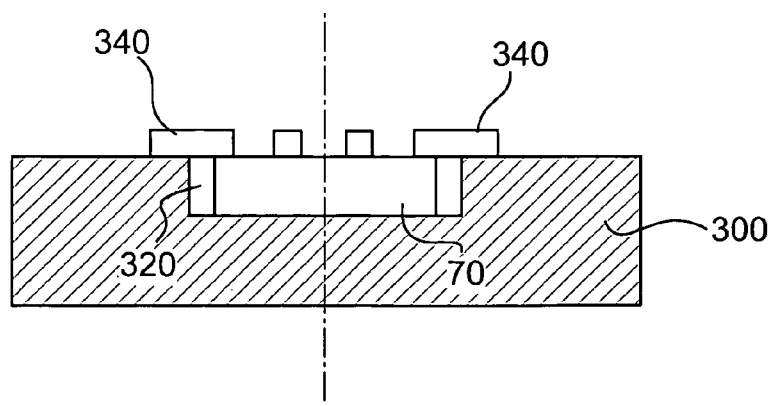
FIG. 6 shows a cross-section of the slotted tool and component along line A-A in FIG. 5.

In another embodiment of the present invention, a slotted tool may be used to assist in connecting the leads discussed above to the LCCC or component 70. FIGS. 5 and 6 show a simplified example of how four leads may be located and positioned for soldering using a slotted tool 340. As would be apparent to one of ordinary skill in the art, the slotted tool shown in FIGS. 5 and 6 may be modified so as to attach as many leads as needed for a given LCCC. The slotted tool may be made of graphite, aluminum, or other suitable materials and may be used to locate leads prior to mass soldering. It should be understood that, in accordance with one embodiment of the present invention, leads 20 or leads 60 may be soldered to the component 70 prior to forming the leads into "C" shaped leads.

As shown in FIG. 5, the slotted tool 300 may be configured to hold the component 70 in a recess or slot 320. The leads 340 may then be located and positioned on the component 70 using the slotted tool 300 prior to soldering. Once located properly, the leads 340 may be soldered to the component 70. After soldering, the leads 340 may be formed into "C" shaped leads as discussed with reference to FIGS. 3C and 4C and then soldered to the PWB as shown in FIGS. 3D and 4D. FIG. 6 shows a cross section of the slotted tool 300 and the component 70 along line A-A. As shown, the component 70 may rest within the recess or slot 320 such that the leads 340, as shown in FIG. 6, may be positioned on the component 70 prior to soldering.

It should be understood that the "C" shape of the leads 20 and 60 discussed above provide the compliant characteristics necessary for the attached integrated circuits and circuit boards to be resistant to thermal cycling. As thermal cycling occurs, the difference in the TCE of the integrated circuit and the PWB induces forces on the leads connecting the integrated circuit and the PWB. The "C" shaped leads in accordance with this invention may bend and twist to absorb these forces, which would otherwise be exerted on the solder joints.

The foregoing descriptions of specific embodiments of the present invention are presented for purposes of illustration and description. They are not intended to be exhaustive or to limit the invention to the precise forms disclosed. Obviously, many modifications and variations are possible in view of the above teachings. While the embodiments were chosen and described in order to best explain the principles of the invention and its practical applications, thereby enabling others skilled in the art to best utilize the invention, various embodiments with various modifications as are suited to the particular use are also possible. The scope of the invention is to be defined only by the claims appended hereto, and by their equivalents.

What is claimed is:

1. A connector system for resiliently attaching and electrically connecting a first set of contacts substantially located on a first surface of a circuit chip to a second set of contacts substantially located on a second surface of a circuit board, the connector system comprising:

a plurality of leads in predetermined spaced relation, each of the plurality of leads being sized and arranged to form a C-shaped body having a first leg and a second leg, the first leg and second leg being substantially parallel with a curved portion between the first leg and the second leg;

each of the plurality of leads including a strip of copper foil folded to form the C-shaped body with the first leg having a first surface configured to connect to at least one of the first set of contacts and the second leg having a second surface configured to connect to at least one of the second set of contacts, the plurality of leads being sized and arranged such that the first surface of the circuit chip is substantially parallel to the second surface of a circuit board; and wherein the plurality of leads defines a separation of about 0.010 inches or less between the first surface of the circuit chip and the second surface of the circuit board.

2. The connector system according to claim 1, wherein the copper foil is about 0.0028 inch thick copper foil.

3. The connector system according to claim 2, wherein the strip of copper foil includes a first liquid solder mask on the first leg and a second liquid solder mask on the second leg.

4. The connector system according to claim 2, wherein the plurality of leads defines a separation of about 0.010 inches or less between the first surface of the circuit chip and the second surface of the circuit board, when the leads are in an uncompressed state.

5. The connector system according to claim 3, wherein exposed surfaces of the copper foil are plated with at least one of immersion silver and immersion tin.

6. The connector system according to claim 3, wherein the plurality of leads defines a separation of about 0.010 inches or less between the first surface of the circuit chip and the second surface of the circuit board, when the leads are in an uncompressed state.

7. The connector system according to claim 5, wherein the strip of the copper foil is approximately 0.028 inches wide.

8. The connector system according to claim 5, wherein the plurality of leads defines a separation of about 0.010 inches or less between the first surface of the circuit chip and the second surface of the circuit board, when the leads are in an uncompressed state.

9. The connector system according to claim 7, wherein the plurality of leads defines a separation of about 0.010 inches or less between the first surface of the circuit chip and the second surface of the circuit board, when the leads are in an uncompressed state.

10. The connector system according to claim 1, wherein the first leg is soldered to at least one of the first contacts using Sn96.5:Ag3.5 solder alloy with a melting point of approximately 221° C.

11. The connector system according to claim 10, wherein the plurality of leads defines a separation of about 0.010 inches or less between the first surface of the circuit chip and the second surface of the circuit board, when the leads are in an uncompressed state.

12. The connector system according to claim 1, wherein the plurality of leads defines a separation of about 0.010 inches or less between the first surface of the circuit chip and the second surface of the circuit board, when the leads are in an uncompressed state.

* * * * *